(12) United States Patent
Slaton et al.

(10) Patent No.: US 11,848,666 B1
(45) Date of Patent: Dec. 19, 2023

(54) METHODS AND DEVICES FOR FAST SWITCHING OF RADIO FREQUENCY SWITCHES

(71) Applicant: pSemi Corporation, San Diego, CA (US)

(72) Inventors: Joseph Porter Slaton, San Diego, CA (US); Parvez Daruwalla, Fremont, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/831,761

(22) Filed: Jun. 3, 2022

(51) Int. Cl.
*H03K 17/041* (2006.01)

(52) U.S. Cl.
CPC .............. *H03K 17/04106* (2013.01)

(58) Field of Classification Search
None
See application file for complete search history.

(56) References Cited

U.S. PATENT DOCUMENTS

| | | | | |
|---|---|---|---|---|
| 4,499,387 A | * | 2/1985 | Konishi | H03K 19/00384 327/329 |
| 7,910,993 B2 | * | 3/2011 | Brindle | H03K 17/687 257/347 |
| 9,184,731 B2 | * | 11/2015 | Lam | H03H 11/245 |
| 10,396,772 B2 | * | 8/2019 | Shanjani | H03K 17/04123 |
| 10,505,579 B2 | * | 12/2019 | Jo | H04B 1/40 |
| 10,763,842 B1 | * | 9/2020 | Dai | H03K 17/102 |
| 11,290,105 B1 | * | 3/2022 | Kovac | H03K 17/693 |
| 11,329,642 B1 | | 5/2022 | Shrivastava et al. | |
| 11,405,031 B1 | * | 8/2022 | Shrivastava | H03K 17/04123 |
| 11,405,034 B1 | * | 8/2022 | Shapiro | H03K 17/693 |
| 11,405,035 B1 | * | 8/2022 | Genc | H03K 19/21 |
| 2005/0152092 A1 | * | 7/2005 | Sibrai | H03H 11/1291 361/271 |
| 2015/0311883 A1 | | 10/2015 | Bakalski | |
| 2016/0329891 A1 | | 11/2016 | Bakalski et al. | |
| 2018/0006634 A1 | * | 1/2018 | Natsume | H03J 3/20 |
| 2019/0267990 A1 | | 8/2019 | Schleicher et al. | |
| 2019/0305768 A1 | * | 10/2019 | Willard | H01L 27/0727 |
| 2020/0098745 A1 | * | 3/2020 | Roig-Guitart | H01L 29/861 |

FOREIGN PATENT DOCUMENTS

| | | | |
|---|---|---|---|
| CN | 107040255 A | 8/2017 | |
| CN | 106230417 B | 8/2019 | |
| EP | 3093988 A4 | * 2/2017 | ........ H02M 3/33569 |

OTHER PUBLICATIONS

International Search Report and Written Opinion issued for International PCT Application No. PCT/US2023/021500 filed May 9, 2023 on behalf of pSemi Corporation. dated Aug. 31, 2023. 10 pages.

* cited by examiner

*Primary Examiner* — Thomas J. Hiltunen
*Assistant Examiner* — Khareem E Almo
(74) *Attorney, Agent, or Firm* — Steinfl + Bruno LLP

(57) ABSTRACT

Methods and devices to reduce the switching time of radio frequency (RF) switches including antenna switches are disclosed. The disclosed teachings include selective bypassing of the capacitive and resistive elements of the circuit during the transition of RF switches from one state to another. Several implementations of the disclosed methods and devices are also presented.

16 Claims, 8 Drawing Sheets

METHODS AND DEVICES FOR FAST SWITCHING OF RADIO FREQUENCY SWITCHES

TECHNICAL FIELD

The present disclosure is related to radio frequency (RF) switches. The disclosed methods and devices can be used to improve the switching time of RF switches including antenna switches.

BACKGROUND

Due to the increasing complexity and stringent system requirements, the design of radio frequency front-end (RFFE) modules has become more challenging. As part of the overall performance requirements, the switching time of the radio frequency (RF) switches including antenna switches implemented as part of such modules is of critical importance. There is generally a need for methods and devices to reduce the switching time of such switches.

SUMMARY

The disclosed methods and devices address the above-mentioned design challenge by reducing the overall RC time constants affecting the switching time of RF switches. As detailed later, this is performed by selectively bypassing certain circuit elements implemented as part of the design of such switches, and when the RF switches are transitioning from one state to another.

According to a first aspect of the disclosure, a radio frequency (RF) switch is provided, comprising: a switch stack including a plurality of transistors arranged in a stack configuration; a plurality of gate resistors, each gate resistor being connected to a gate terminal of a corresponding transistor of the plurality of transistors, the plurality of gate resistors being tied together at a first terminal of the RF switch; a capacitor coupling the first terminal to ground; and a first switch coupled across the capacitor; the first switch being configured to selectively bypass the capacitor during a transition of the switch stack from an ON state to an OFF state or from the OFF state to the ON state According to a second aspect of the disclosure, a radio frequency (RF) switch is provided, comprising: a switch stack including a plurality of transistors arranged in a stack configuration; a plurality of gate resistors, each gate resistor being connected to a gate terminal of a corresponding transistor of the plurality of transistors, the plurality of gate resistors being tied together at a first terminal of the RF switch; a first capacitor and a second capacitor, each of the first capacitor and the second capacitor being configured to be selectively and independently: switched in to couple the first terminal to ground, or switched out to decouple the first terminal from ground; and a series resistor connecting a second terminal of the RF switch to the first terminal, wherein the first capacitor is pre-charged with a positive bias voltage and the second capacitor is pre-charged with a negative bias voltage.

According to a third aspect of the disclosure, a radio frequency (RF) switch is provided, comprising: a switch stack including a plurality of transistors arranged in a stack configuration; a plurality of gate resistors, each gate resistor being connected to a gate terminal of a corresponding transistor of the plurality of transistors, the plurality of gate resistors being tied together at a first terminal of the RF switch; a capacitor with a first capacitor terminal and a second capacitor terminal, the capacitor being a pre-charged capacitor; a series resistor connecting a second terminal of the RF switch to the first terminal; wherein: during a transition of the switch stack from an ON state to an OFF state, or the OFF state to the ON state, the capacitor is configured to couple the first terminal to ground such that selectively: either the first capacitor terminal is connected to the first terminal and the second capacitor terminal is connected to the ground, or the second capacitor terminal is connected to the first terminal and the first capacitor terminal is connected to the ground.

According to a fourth aspect of the disclosure, a radio frequency (RF) switch is provided, comprising: a switch stack including a plurality of transistors arranged in a stack configuration; a plurality of gate resistors, each gate resistor being connected to a gate terminal of a corresponding transistor of the plurality of transistors, the plurality of gate resistors being tied together at a first terminal of the RF switch; a capacitor coupling the first terminal to ground; a series resistor connecting a second terminal of the RF switch to the first terminal, and a plurality of gate switches in a ladder configuration, configured to bypass the plurality of gate resistors during a transition of the switch stack from ON to OFF or vice versa and wherein, a drain or source terminal of each gate switch is connected to a gate terminal of a corresponding first transistor of the plurality of transistors, and a source or drain terminal of each gate switch being connected to a gate terminal of a corresponding second transistor of the plurality of transistors, the first and the second transistor being adjacent transistors.

According to a fifth aspect of the disclosure, a method of reducing switching time of a radio frequency (RF) switch is disclosed, the RF switch comprising: a switch stack including a plurality of transistors arranged in a stack configuration; a plurality of gate resistors, each gate resistor being connected to a gate terminal of a corresponding transistor of the plurality of transistors, the plurality of gate resistors being tied together at a first terminal of the RF switch; a capacitor coupling the first terminal to ground; and a series resistor connecting a second terminal of the RF switch to the first terminal, the method comprising: when transitioning from an ON state to on OFF state or from the OFF state to the ON state: in a first step, bypassing the plurality of gate resistors, and in a second step, delayed from the first step, bypassing the capacitor.

Further aspects of the disclosure are provided in the description, drawings and claims of the present application.

DETAILED DESCRIPTION

Figure 1:
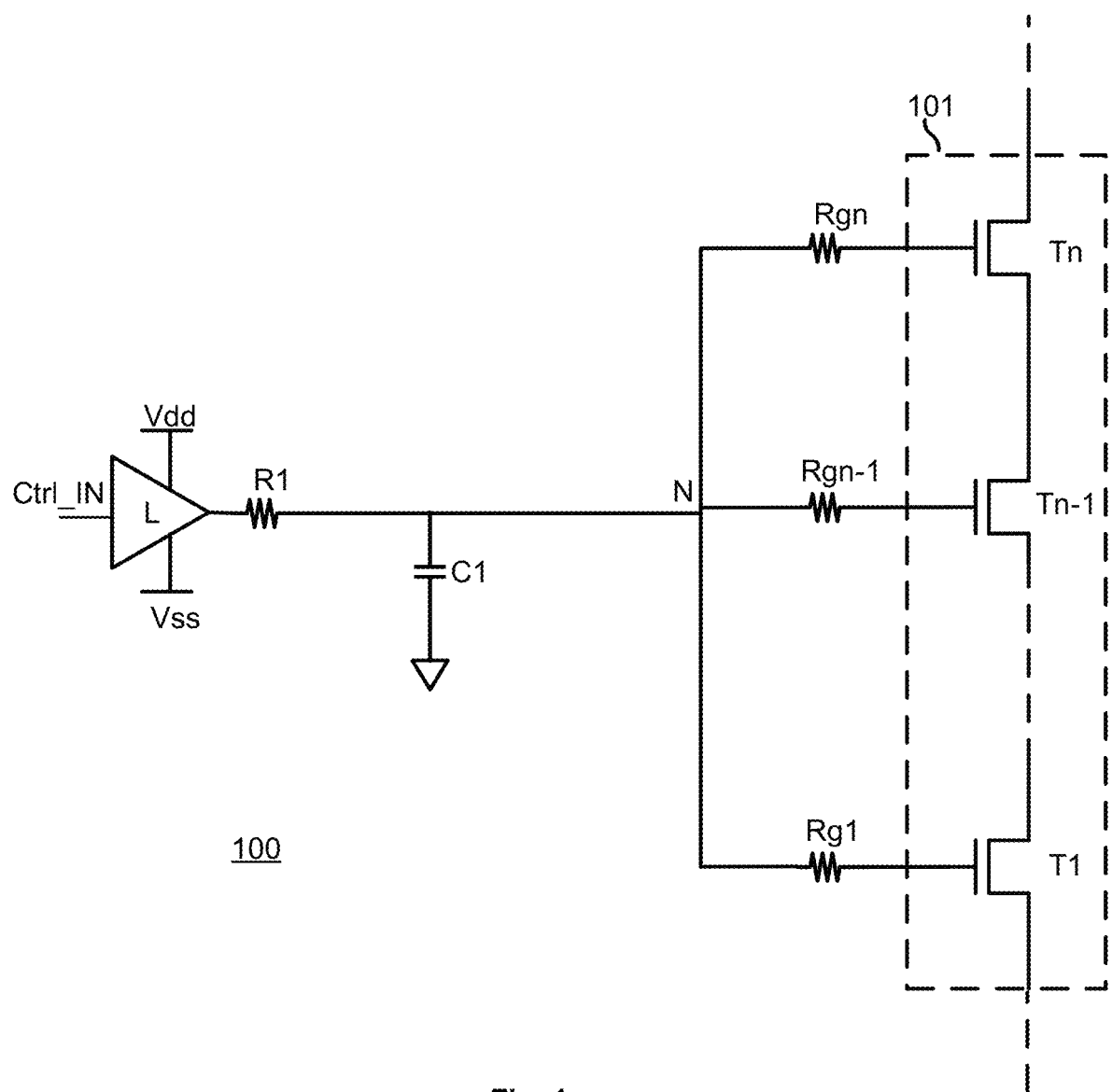
FIG. 1 shows a radio frequency (RF) switch.

FIG. 1 shows an RF switch (100) comprising switch stack (101) which includes transistors (T1, . . . , Tn) with corresponding gate resistors (Rg1, ..., Rgn). Transistor (T1) is referred to as the transistor disposed at the bottom of switch stack (101), and, in case of a shunt switch, the source terminal of transistor (T1) may be connected to a reference voltage or ground. Moreover, transistor (Tn) is referred to as the transistor disposed at the top of the switch stack (101), and the drain terminal of transistor (Tn) may be coupled to the RF antenna or a terminal receiving an RF signal.

Continuing with FIG. 1, RF switch (100) further includes switch driver (L) operating with positive voltage (Vdd) and negative voltage (Vss) to provide positive and negative bias voltages (e.g. +Vbias, −Vbias), at a first terminal (N) of the circuit. The voltages (+Vbias, −Vbias) are used by switch stack (101) to turn the switch in the ON or OFF state, or vice versa. Series resistor (R1) connects a second terminal of the RF switch to the first terminal (N). Resistor (R1) and capacitor (C1) form an RC filter at the output of switch driver (L) to reduce the voltage swing at the switch driver (L) due to RF power and improve linearity. The control signal to control the state of the switch stack (101) is applied to input (IN) of switch driver (L). As known in the art, in operative conditions, the combination of individual gate resistors (Rg1, ..., Rgn), common gate resistor (R1), capacitor (C1) and intrinsic capacitances of transistors (T1, ..., Tn) determines the overall RC time constant of the circuit, and hence the switching time of switch stack (101) when transitioning from one state to another (ON to OFF or OFF to ON). As an example, the combination of a gate resistor (Rgi) with the intrinsic capacitance of the corresponding transistor (Ti) will determine the switching time of transistor (Ti) during a transition of RF switch stack (101) from the ON to OFF state or vice versa.

In what follows, methods and devices to reduce the overall RC time constant and hence to improve the switching time of RF switches will be disclosed. This is done based on the exemplary RF switch (100) of FIG. 1, although the described methods and devices are also applicable to switches having different topologies.

Figure 2A:
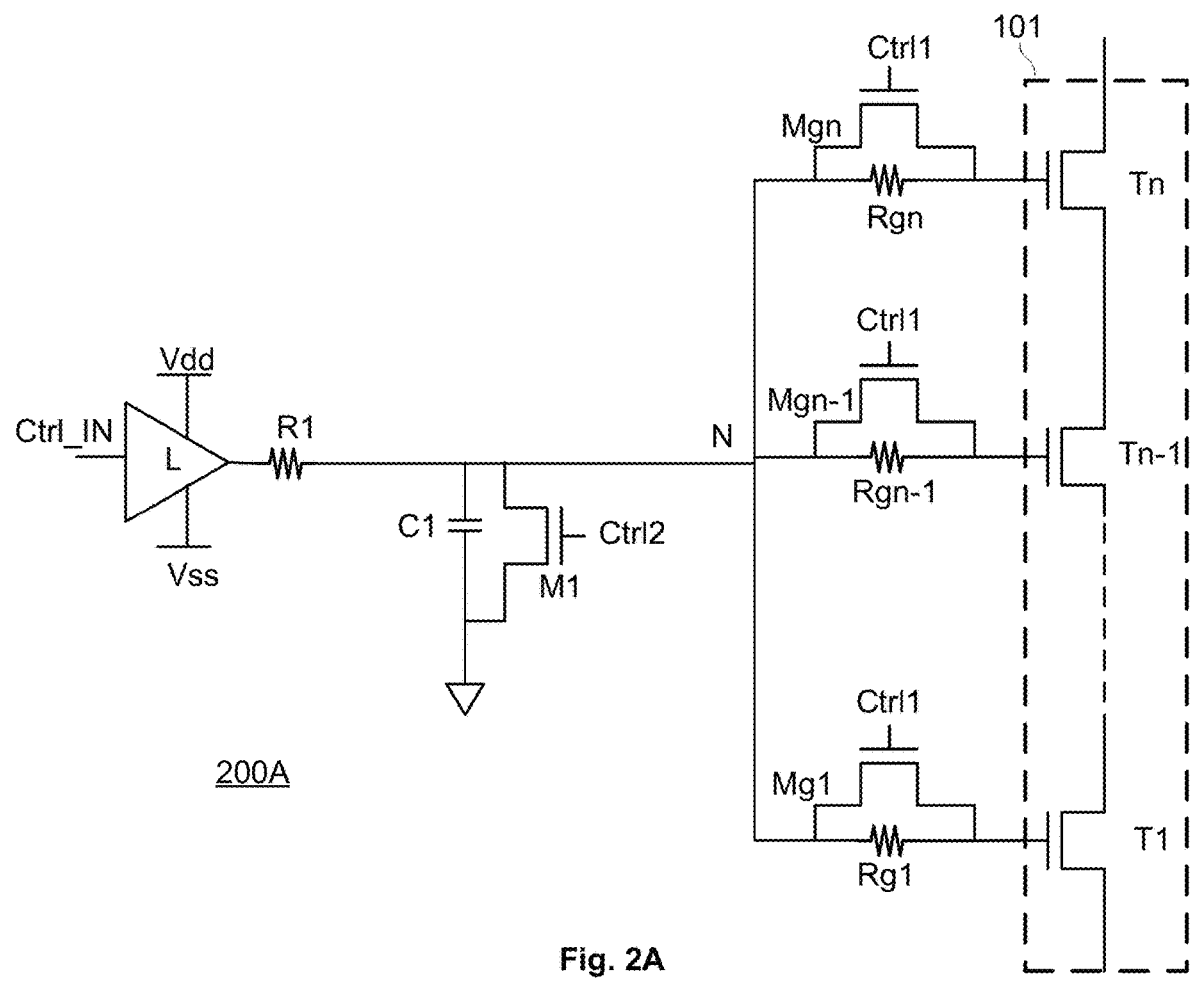
FIG. 2A shows an exemplary RF switch according to an embodiment of the present disclosure.

FIG. 2A shows an exemplary RF switch (200A) according to an embodiment of the present disclosure. Differently from RF switch (100) of FIG. 1, RF switch (200A) further comprises gate switches (Mg1, ..., Mgn) disposed/coupled across corresponding gate resistors (Rg1, ..., Rgn) and switch (M1) coupled across capacitor (C1), wherein capacitor (C1) coupled terminal (N) of the switch (220A) to ground. Gate switches (Mg1, ..., Mgn) are used to bypass/short the corresponding resistors (Rg1, ..., Rgn) when the switch stack (101) is transitioning from one state to another (OFF to ON or ON to OFF). As a result, the intrinsic charge of switch stack (101) is discharged. Similarly, switch (M1) is used to selectively short capacitor (C1) when such transitioning occurs. In other words, by selectively (and for a short time) bypassing/shorting R and/or C elements of the circuit, the overall RC time constant of the circuit can be reduced to improve the switching time of switch stack (101). As also shown, switches (Mg1, ..., Mgn) are controlled by control pulse (Ctrl1), and switch (M1) is controlled by control pulse (Ctrl2).

Figure 2B:
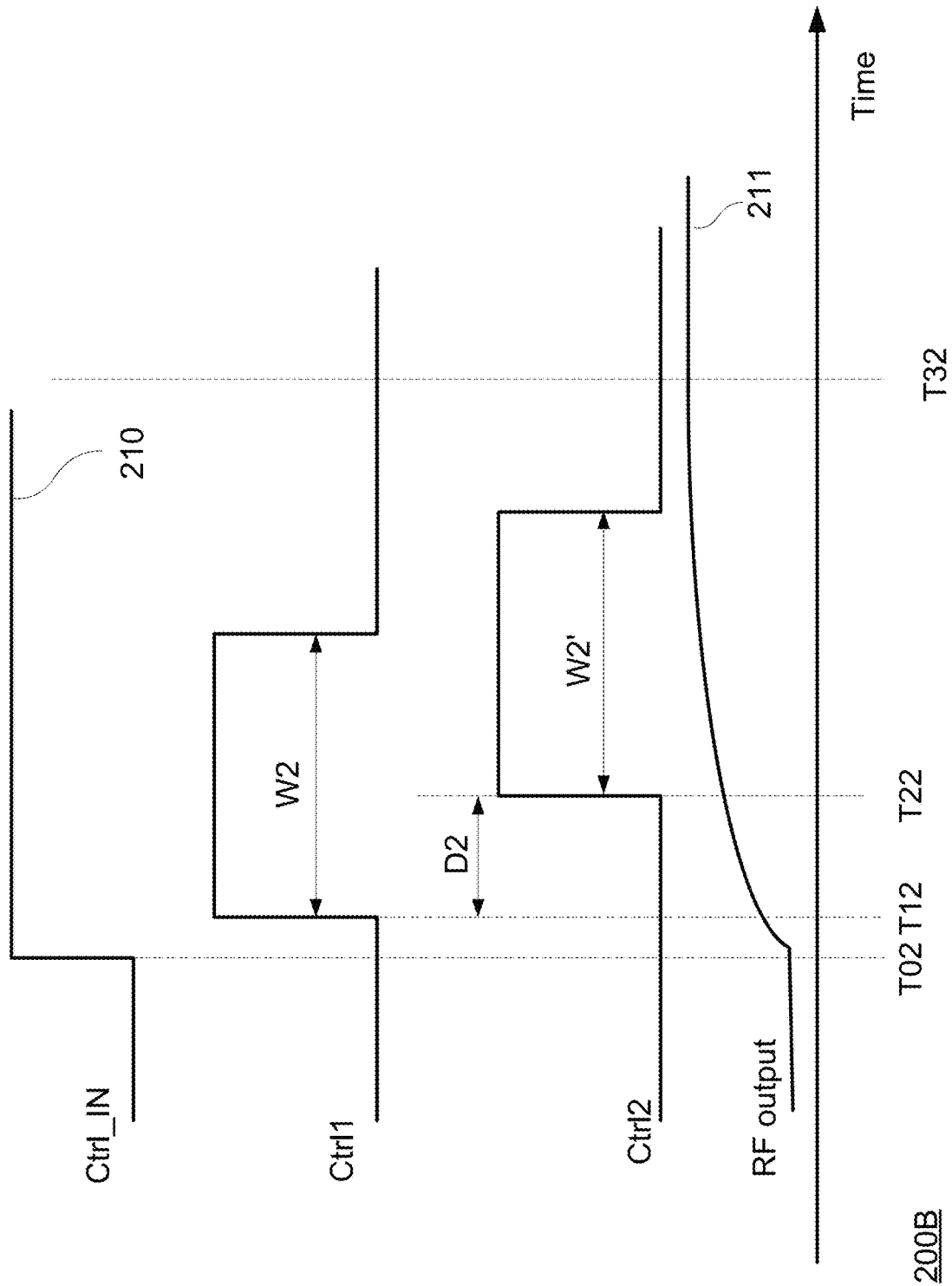
FIG. 2B shows an exemplary timing diagram of bypassing various elements in an RF switch according to an embodiment of the present disclosure.

According to the teachings of the present disclosure, the controlling switches (M1, Mg1, ..., Mgn) of FIG. 2A to switch out/short various resistive and capacitive elements of switch (200A) during transition may be implemented according to a certain timing. This is illustrated in FIG. 2B which shows an exemplary timing diagram of the present disclosure. A rising edge (this may be a falling edge in a different embodiment) occurring at time instant (T02), in control signal (210) applied to input (Ctrl_IN) of FIG. 2A, indicates the start of a transition of switch stack (101) of FIG. 2A from the ON to OFF state or vice versa. Referring to FIGS. 2A-2B, according to an embodiment of the present disclosure, briefly following such rising edge, at time instant (T12), control pulse (Ctrl1) is applied to the gate terminals of switches (Mg1, ..., Mgn) to bypass/short corresponding gate resistors (Rg1, ..., Rgn). After a delay/separation time (D2) as shown in FIG. 2B, at time instant (T22), pulse control (Ctrl2) is applied to the gate terminal of switch (M1) to bypass capacitor (C1). As a result, gate resistors (Rg1, ..., Rgn) and capacitor (C1) are bypassed for durations which are equal to the pulse widths (W2, W2') of control pulses (Ctrl1, Ctrl2), respectively. In an embodiment, pulse widths (W2, W2') may be equal.

The overall improvement of the switch stack switching time is a function of pulse widths (W2, W2') and the separation time (D2) between control pulses (Ctrl1, Ctrl2). The design choice and optimization for the control pulse widths (W2, W2'), and separation time (D2), may be made based on the application, and may involve a proper tradeoff between the required space and the overall performance requirement (e.g. insertion loss, linearity, etc.). In other words, as an example, the size of transistors (T1, ..., Tn) will affect how the control pulse widths (W2, W2') and separation time (D2) are chosen for an optimized improvement of the switch stack switching time. In an exemplary embodiment, the pulse widths (W2, W2') may be 100 nsec. As also shown in the exemplary timing diagram of FIG. 2B, at instant (T32) the switching of the switch stack is finalized and the switch reaches a steady ON or OFF state. Signal (211) represents the timing of the RF output (switch OFF to ON). Such signal illustrates how the RF output gradually transitions from one level (e.g. corresponding to the OFF state) to another level (e.g. corresponding to the ON state). The exemplary timing shown in FIG. 2B corresponds to the case where the bypassing takes place during the transition (after T02), and ends before the transition is completed (before T32). In some embodiments, the bypassing of some elements may last until the switch stack transition is finalized, i.e. closer to T32 than shown in the figure. As shown in FIG. 2B, in general, D2+W2'<T32.

Figure 3A:
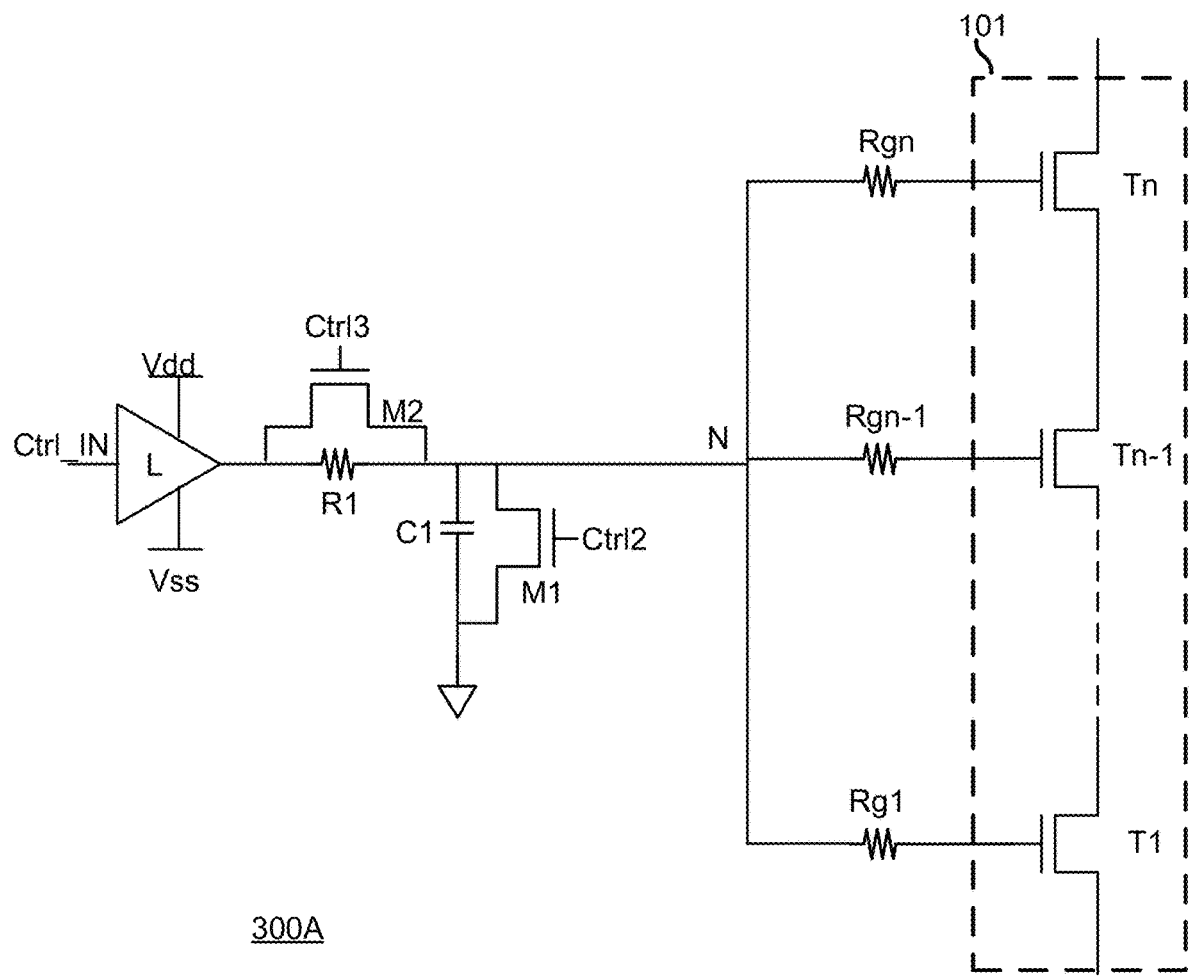
FIG. 3A shows an exemplary RF switch according to an embodiment of the present disclosure.

FIG. 3A shows an exemplary RF switch (300A) according to a further embodiment of the present disclosure. The principle of operation of such switch is similar to what was described with regards to RF switch (100) of FIG. 1, except that RF switch (300A) further implements switch (M1) coupled across capacitor (C1) and switch (M2) coupled across common gate resistor (R1). The function of switches (M1, M2) is to bypass capacitor (C1) and common gate resistor (R1) respectively, during a transition of switch stack (101) from one state to another. This will reduce the overall RC time constant of the circuit in transition, resulting in an improvement in the switching time of switch stack (101). As also shown in FIG. 3A, switches (M1, M2) are controlled by control signals (Ctrl2, Ctrl3) respectively.

Figure 3B:
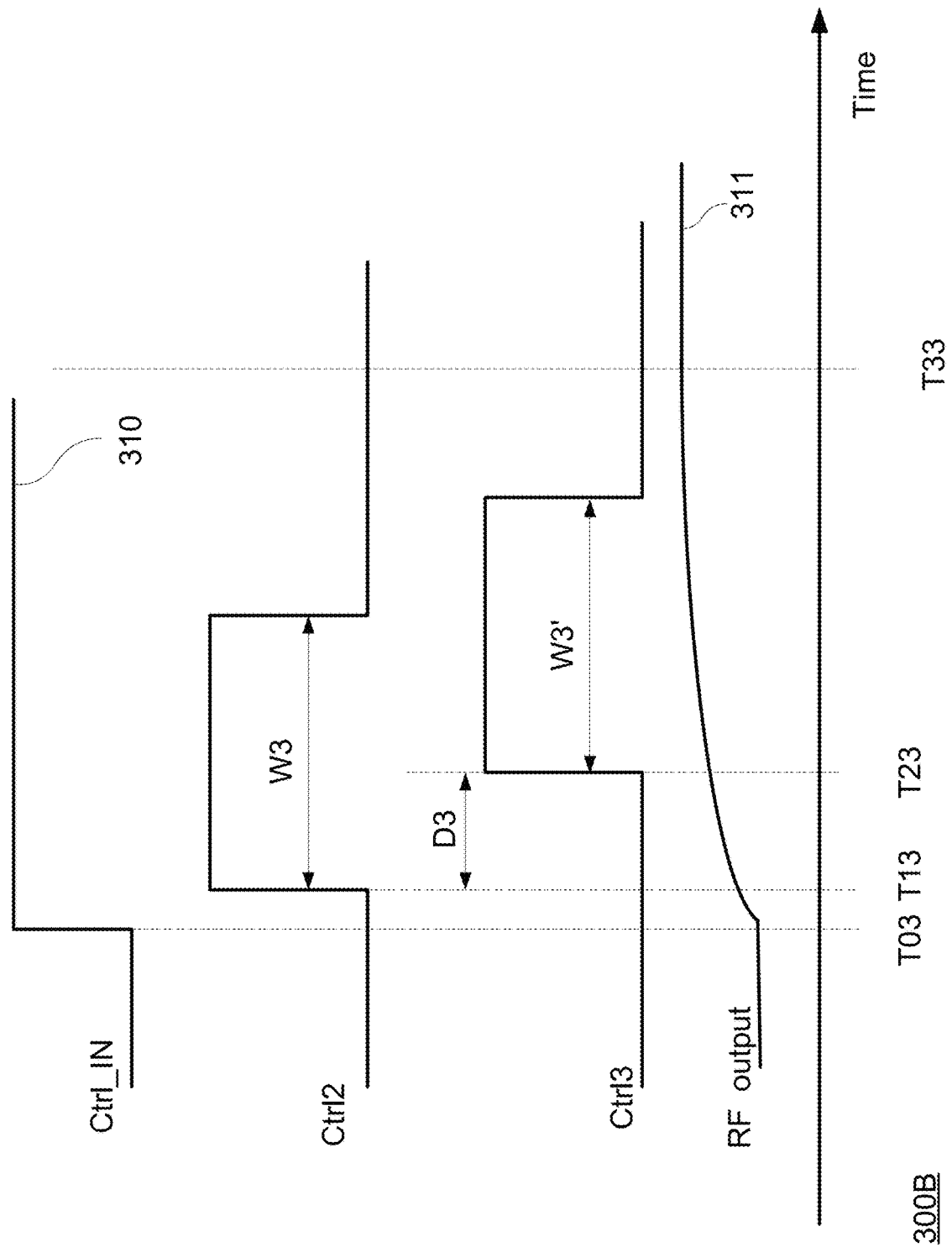
FIG. 3B shows an exemplary timing diagram of bypassing various elements in an RF switch according to an embodiment of the present disclosure.

FIG. 3B shows an exemplary timing diagram (300B) illustrating the timing of control signals (Ctrl2, Ctrl3). A rising edge (this may be a falling edge in a different embodiment), occurring at time instant (T03), in control signal (310) applied to input (Ctrl_IN) of FIG. 3A, indicates the start of a transition of switch stack (101) of FIG. 3A from the ON to OFF state or vice versa. Referring to FIGS. 3A-3B, according to an embodiment of the present disclosure, following such rising edge, at time instant (T13), control pulse (Ctrl2) is applied to the gate terminal of switch (M1) to bypass/short capacitor (C1). After a separation time (D3) as shown in FIG. 3B, at time instant (T32 T23), pulse control (Ctrl3) is applied to the gate terminal of switch (M2) to bypass common gate resistor (R1). As a result, common gate resistor (R1) and capacitor (C1) are bypassed for durations which are equal to pulse widths (W3, W3') of control pulses (Ctrl2, Ctrl3), respectively. In an embodiment, pulse widths (W3, W3') may be equal. As mentioned previously with regards to the embodiment of FIG. 2A, also in this case the overall improvement of the switch stack switching time is a function of pulse widths (W3, W3') and the separation time (D3) between control pulses (Ctrl2, Ctrl3). The design choice for the control pulse widths (W3, W3') and separation time (D3), may be made based on the application, and may involve a proper tradeoff between the space and the overall performance requirement (e.g. insertion loss, linearity, etc.). As also shown in the exemplary timing diagram of FIG. 3B, at instant (T33) the switching of the switch stack is finalized and the switch reaches a steady ON or OFF state. Signal (311) represents the timing of the RF output (switch OFF to ON). Such signal illustrates how the RF Output gradually transition from one level (e.g. corresponding to OFF state) to another level (e.g. corresponding to the ON state). The exemplary timing shown in FIG. 3B corresponds to the case where the bypassing takes place during the transition (after T03), and ends before the transition is completed (before T32). In some embodiments, the bypassing of some elements may last until the switch stack transition is finalized, i.e. closer to T33 than shown in the figure. As shown in FIG. 3B, in general, D3+W3'<T33.

With reference back to FIG. 1, when switch stack (101) is in the ON state, terminal (N) is at a positive voltage +Vbias (e.g. 3.5V), and when the switch is in OFF state, terminal (N) is at a negative voltage −Vbias. In other words, as an example, when the switch stack is transitioning from the ON to the OFF state, capacitor (C1) has to be discharged from the positive charge and then recharged to a negative charge such that the vias voltage at terminal (N) changes from positive voltage +Vbias to negative voltage −Vbias. Such change in polarity takes time, resulting in negative impact on the switching time. The disclosed methods and devices address this issue by implementing pre-charged capacitors as described more in detail below, through the next exemplary embodiment.

Figure 4:
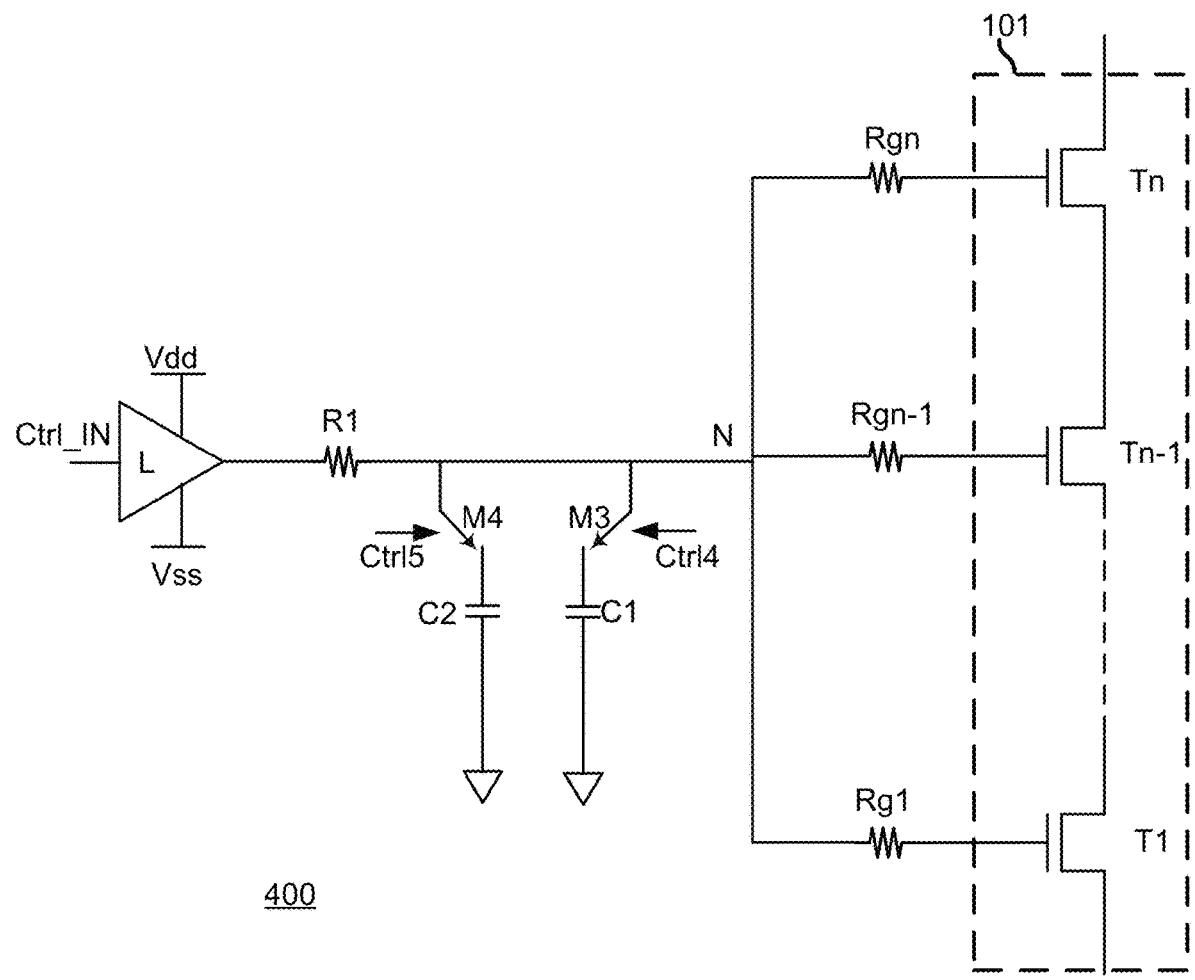
FIGS. 4-6 shows exemplary RF switches according to embodiments of the present disclosure.
Like reference numbers and designations in the various drawings indicate like elements.

FIG. 4 shows an exemplary RF switch (400) according to yet another embodiment of the present disclosure. As described previously with regards to RF switch (100) of FIG. 1, during operative conditions, when switch stack (101) is in an ON state, terminal (N) is at positive bias voltage (+Vbias), and when the switch stack (101) is in an OFF state, terminal (N) sits at negative bias voltage (−Vbias). RF switch (400) is similar to RF switch (100) of FIG. 1, except that RF switch (400) further comprises capacitors (C1, C2) that can be selectively connected to/disconnected from terminal (N) through switches (M3, M4). Capacitors (C1, C2) are pre-charged such that the voltages across capacitors (C1, C2) are (+Vbias, −Vbias) respectively. When switch stack (101) is in the ON state, capacitor (C1) is switched in and capacitor (C2) is switched out, and as a result, terminal (N) is at positive voltage +Vbias. When transitioning from the ON to the OFF state, capacitor (C1) is switched out and capacitor (C2) is switched in and as a result, terminal (N) will sit now at negative bias voltage (−Vbias). The connection and disconnection of capacitors (C1, C2) are performed through switches (M3, M4) respectively. As also shown in FIG. 4, switches (M3, M4) are controlled through control signals (Ctrl4, Ctrl5). In accordance with the teachings of the present disclosure, during the transition of the switch stack, care must be taken to avoid any overlap when switching in and out capacitors (C1, C2). In other words, one capacitor should be completely switched out before the other capacitor is switched in. In an embodiment, switches (M3, M4) are implemented using field-effect transistor (FET) switches.

Figure 5:
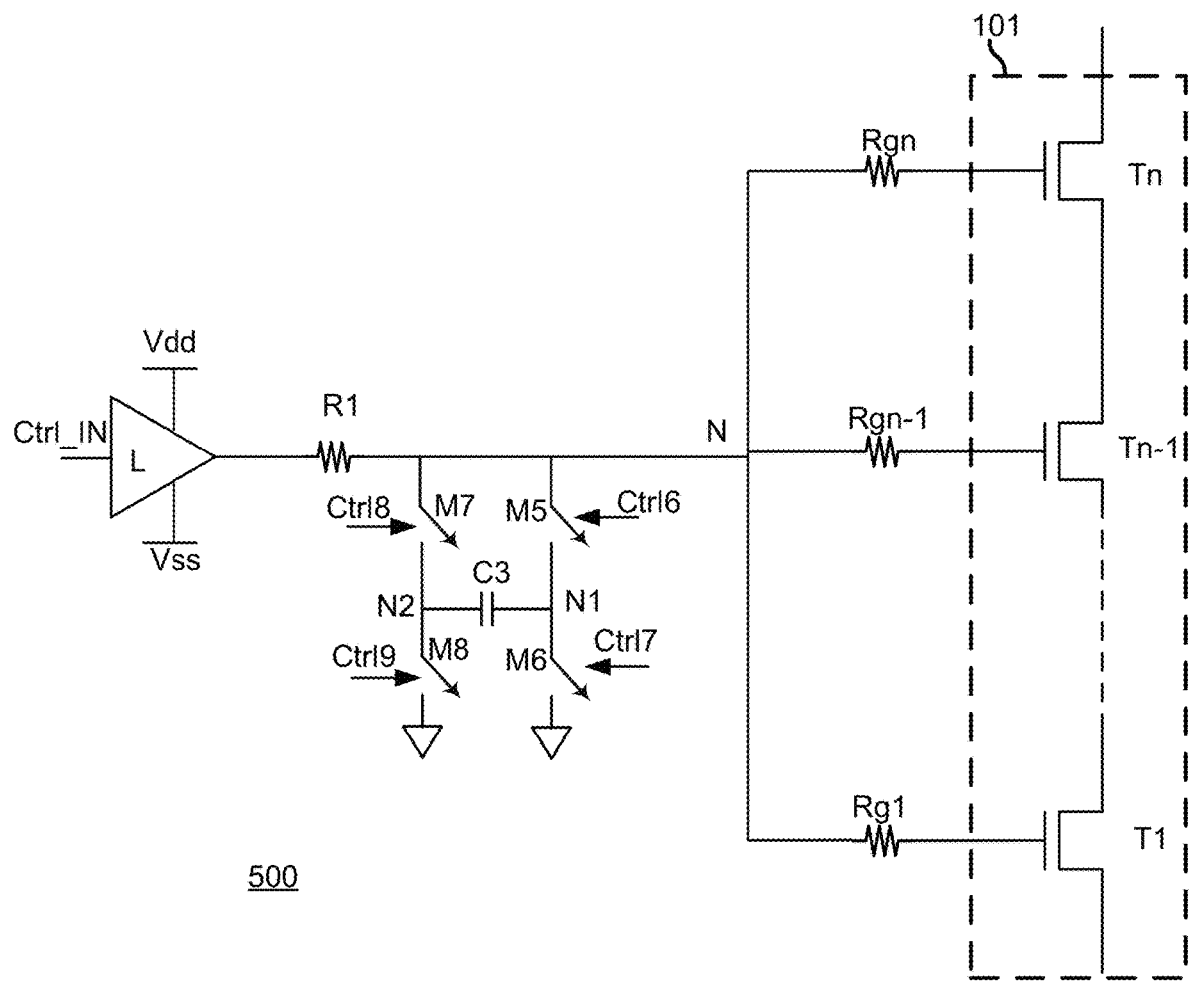

FIG. 5 shows an exemplary RF switch (500) according to a further embodiment of the present disclosure. In this switch, instead of two pre-charged capacitors as implemented in the embodiment of FIG. 4, a single pre-charged capacitor (C3) is implemented. Capacitor (C3) is pre-charged to a charge that results in a voltage of Vbias across capacitor (C3). RF switch (500) further comprises switches (M5, M6, M7, M8). The function of such switches is to connect capacitor (C3) across terminal (N) and ground such that terminal (N) receives the proper bias voltage (i.e. +Vbias or −Vbias) when switch stack (101) is in the ON or OFF state. In other to further clarify that, we consider the example where capacitor (C3) is pre-charged such that there is a positive voltage (+Vbias) from terminal (N2) to terminal (N1) of such capacitor. In operative conditions, when the switch stack (101) is in the ON state, switches (M5, M8) are ON (closed), and switches (M6, M7) are OFF (open), and as a result, terminal (N) will sit at positive bias voltage (+Vbias). On the other hand, when switch stack (101) is in OFF state, switches (M5, M8) are OFF (open), and switches (M6, M7) are ON (closed) and therefore, terminal (N) will be this time at negative bias voltage (−Vbias). Compared to the embodiment of FIG. 4, RF switch (500) required less die space as one capacitor (as opposed to two) is implemented, and the size of additional switches is smaller compared to the size of an additional capacitor. As also shown in FIG. 5, switches (M5, M6, M7, M8) are controlled with control signals (Ctrl6, Ctrl7, Ctrl8, Ctrl9) respectively. In an embodiment, each of the switches (M5, M6, M7, M8) may be implemented using FETs.

Figure 6:
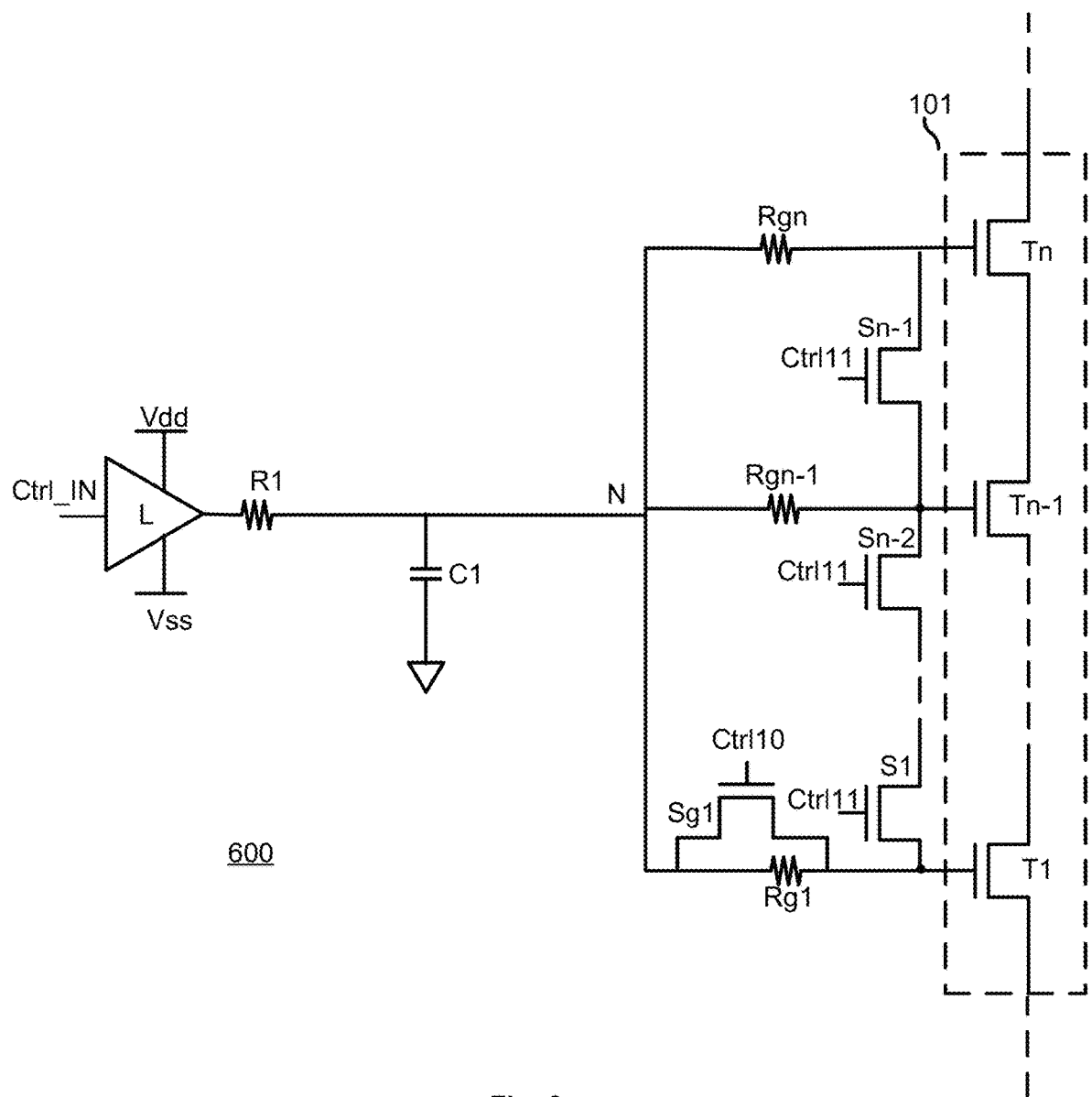

FIG. 6 shows an exemplary RF switch (600) according to an embodiment of the present disclosure. In this RF switch, gate switches (S1, . . . , Sn−1) are implemented in a ladder configuration to bypass the gate resistors and short/tie the gate terminals of transistors (T1, . . . , Tn) together during the transition of the control signal of the main switch. Each of the gate switches (S1, . . . , Sn−1) has a drain/source terminal connected to a gate terminal of a corresponding transistor (Ti) of the transistors (T1, . . . , Tn) and a source/drain terminal connected to a gate terminal of an adjacent transistor (Ti+1 or Ti−1) of the transistors (T1, . . . Tn). This results in a discharge of switch stack (101) from intrinsic charges. In order to further improve the switching time of switch stack (101), switch (Sg1) may also be optionally implemented across resistor (Rg1) to bypass such resistor during the transition of switch stack (101) from one state to another. In the embodiments implementing switch (Sg1), bypassing resistor (Rg1) may be performed after shorting the gate terminals of switch stack together. As also shown in FIG. 6, switches (Si, . . . , Sn−1) are controlled through control signal (Ctrl11) and switch (Sg1) is controlled by control signal (Ctrl10).

With reference back to FIG. 2A, each of the switches (Mg1, . . . , Mgn) is designed to handle the full voltage swing across corresponding gate resistors. In other words, each of such switches may be implemented as a stack of several transistors for a better voltage handling, however this will add to the occupied space on the die. RF switch (600) of FIG. 6 may be a preferred alternative in the applications where more stringent die area requirements are imposed. For bypassing purposes, as opposed to a set of "n" bypassing stacked transistors (one per individual gate resistor), RF switch (600) implements a first "rail" stack including switches (S1, . . . , Sn−1) and optionally one additional "rung" switch stack (Sg1), implemented across gate resistor (Rg1). This will save some die space compared to the embodiment of FIG. 2A.

With continued reference to FIG. 6, according to an embodiment of the present disclosure, switch (Sg1) may be implemented across any of the gate resistors (Rg1, . . . , Rgn). In applications where switch stack (101) is used in a shunt configuration where the bottom of the switch is at a reference voltage (as opposed to a series configuration where both the top and the bottom of the switch handle varying RF signals), the preferred solution is to implement switch (Sg1) across the gate resistor located at the bottom of the switch stack (i.e. Rg1). The reason is that when in shunt configuration, there is less voltage swing to be handled at the bottom of the stack by switch (Sg1) being coupled across resistor (Rg1). This means that switch (Sg1) may be implemented as a stack having either a smaller number of transistors or transistors smaller in size. This provides the benefit of saving some die area.

According to the teachings of the present disclosure, the disclosed bypassing schemes for each embodiment may be additionally adopted in combination with another embodiment using a different bypassing scheme. This is further clarified in below by way of few examples and not of limitation:

With reference to FIG. 2A, the presence of switch (M1) or switches (Mg1, . . . , Mgn) is optional. In an embodiment, only switch (M1) may be implemented. A different embodiment may only implement switches (Mg1, . . . , Mgn) while switch (M1) is left out. The choice among these options may be driven by the required overall circuit performance, cost and die area.

The embodiments of FIGS. 2A and 3A may be combined, such that switches (Mg1, . . . , Mgn), and switches (M1, M2) are all implemented in the same circuit.

Similarly, a combination of the embodiments of FIGS. 3A and 6 may also be envisaged.

Switches (Mg1, . . . , Mgn) of FIG. 2A may be added to the embodiments of FIG. 4 or 5 for further improvement of the switching time.

The inventors have demonstrated through simulations that, depending on the application, up to 70% improvement of the switching time may be achieved in some embodiments.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) switch comprising:
a switch stack including a plurality of transistors arranged in a stack configuration;
a plurality of gate resistors, each gate resistor being connected to a gate terminal of a corresponding transistor of the plurality of transistors, the plurality of gate resistors being tied together at a first terminal of the RF switch;
a capacitor coupling the first terminal to ground;
a first switch coupled across the capacitor; the first switch being configured to selectively bypass the capacitor during a transition of the switch stack from an ON state to an OFF state and from the OFF state to the ON state, and
a plurality of gate switches, each gate switch being:
coupled across a corresponding gate resistor of the plurality of gate resistors, and
configured to bypass the corresponding gate resistor during the transition of the switch stack from the ON state to the OFF state or from the OFF state to the ON state.

2. The RF switch of claim 1, wherein during the transition of the switch stack from the ON state to the OFF state or from the OFF state to the ON state, the RF switch is configured to:
in a first step, close the plurality of gate switches and bypass the plurality of gate resistors, and
and in a second step, delayed from the first step by a first delay, close the first switch and bypass the capacitor.

3. A radio frequency (RF) switch comprising:
a switch stack including a plurality of transistors arranged in a stack configuration;
a plurality of gate resistors, each gate resistor being connected to a gate terminal of a corresponding transistor of the plurality of transistors, the plurality of gate resistors being tied together at a first terminal of the RF switch;
a capacitor coupling the first terminal to ground;
a first switch coupled across the capacitor; the first switch being configured to selectively bypass the capacitor during a transition of the switch stack from an ON state to an OFF state and from the OFF state to the ON state, and
a series resistor connecting a second terminal of the RF switch to the first terminal, and a second switch coupled across the series resistor, the second switch being configured to bypass the series resistor during the transition of the switch stack from the ON state to the OFF state or from the OFF state to the ON state.

4. The RF switch of claim 3, wherein during the transition of the switch stack from the ON state to the OFF state or from the OFF state to the ON state, the RF switch is configured to:
in a first step, close the first switch and bypass the capacitor, and
in a second step, delayed from the first step by a first delay, close the second switch and bypass the series resistor.

5. The RF switch of claim 2, wherein:
the plurality of gate switches are controlled with a first control pulse applied at gate terminals of the plurality of gate switches;
the first switch is controlled with a second control pulse applied at a gate terminal of the first switch; and
a width of the first and the second control pulses and the first delay are selected based on a switching time of the switch stack.

6. The RF switch of claim 4, wherein:
the first switch is controlled with a first control pulse applied at a gate terminal of the first switch;
the second switch is controlled with a second control pulse applied at a gate terminal of the second switch; and
a width of the first and the second control pulses and the first delay are selected based on a switching time of the switch stack.

7. A radio frequency (RF) switch comprising:
a switch stack including a plurality of transistors arranged in a stack configuration;
a plurality of gate resistors, each gate resistor being connected to a gate terminal of a corresponding transistor of the plurality of transistors, the plurality of gate resistors being tied together at a first terminal of the RF switch;
a capacitor with a first capacitor terminal and a second capacitor terminal, the capacitor being a pre-charged capacitor;
a series resistor connecting a second terminal of the RF switch to the first terminal;
a first switch connecting the first terminal to the first capacitor terminal;
a second switch connecting the first capacitor terminal to ground;
a third switch connecting the first terminal to the second capacitor terminal, and
a fourth switch connecting the second capacitor terminal to ground;
wherein:
during a transition of the switch stack from an ON state to an OFF state, or the OFF state to the ON state, the capacitor is configured to couple the first terminal to ground such that selectively:
either the first capacitor terminal is connected to the first terminal and the second capacitor terminal is connected to the ground, or
the second capacitor terminal is connected to the first terminal and the first capacitor terminal is connected to the ground.

8. The RF switch of claim 7, wherein:
during the transition of the switch stack from the ON to the OFF state, the first and the third switches are open and the second and the fourth switches are closed, and during the transition of the switch stack from the OFF state to the ON state, the first and the third switches are closed, and the second and the fourth switches are open.

9. A radio frequency (RF) switch comprising:
a switch stack including a plurality of transistors arranged in a stack configuration;
a plurality of gate resistors, each gate resistor being connected to a gate terminal of a corresponding transistor of the plurality of transistors, the plurality of gate resistors being tied together at a first terminal of the RF switch;
a capacitor coupling the first terminal to ground;
a series resistor connecting a second terminal of the RF switch to the first terminal, and
a plurality of gate switches in a ladder configuration, configured to bypass the plurality of gate resistors during a transition of the switch stack from ON to OFF or vice versa and
wherein, a drain or source terminal of each gate switch is connected to a gate terminal of a corresponding first transistor of the plurality of transistors, and a source or drain terminal of each gate switch being connected to a gate terminal of a corresponding second transistor of the plurality of transistors, the first and the second transistor being adjacent transistors.

10. The RF switch of claim 9, further comprising a resistor switch coupled across a gate resistor of the plurality of gate resistors; the resistor switch being configured to selectively bypass the gate resistor during the transition of the switch stack from ON to OFF or vice versa.

11. The RF switch of claim 10, wherein during the transition of the switch stack from ON to OFF or vice versa, the RF switch is configured to:
in a first step, close the plurality of gate switches and bypass the plurality of gate resistors, and
in a second step, optionally delayed from the first step by a first delay, close the resistor switch and further bypass the gate resistor coupled across the resistor switch.

12. The RF switch of claim 11, wherein:
the plurality of gate switches are controlled with a first control pulse applied at gate terminals of the plurality of gate switches;
the resistor switch is controlled with a second control pulse applied at a gate terminal of the resistor switch; and
a width of the first and the second control pulses and the first delay are selected based on a switching time of the switch stack.

13. The RF switch of claim 10, wherein the gate resistor across the resistor switch is connected to a gate terminal of a transistor disposed in a bottom of the switch stack.

14. The RF switch of claim 1, further comprising a switch driver connected to a series resistor, the switch driver being configured to provide:
a positive bias voltage at the first terminal when the switch stack is in an ON state, and
a negative bias voltage at the first terminal when the switch stack is in in OFF state.

15. The RF switch of claim 1, wherein the plurality of gate switches comprises field-effect transistors (FET).

16. The RF switch of claim 1, wherein the first switch is a FET switch.

* * * * *